HIGH VOLTAGE RECTIFIER

Filed Oct. 19, 1960

Robert G. Denkewalter,
Donald J. Shombert,
*INVENTORS.*

*BY.*

Walter Katz

*ATTORNEY.*

United States Patent Office 3,231,793

Patented Jan. 25, 1966

3,231,793

HIGH VOLTAGE RECTIFIER

Robert G. Denkewalter, Westfield, and Donald J. Shombert, North Plainfield, N.J., assignors to Merck & Co., Inc., Rahway, N.J., a corporation of New Jersey Filed Oct. 19, 1960, Ser. No. 63,564

3 Claims. (Cl. 317—234)

This invention relates to semiconductor devices and more particularly to semiconductor diodes primarily adapted for high voltage rectification.

There has been a long felt need in the semiconductor device applications technology for semiconductor rectifiers capable of withstanding high peak inverse voltages. Although a high peak inverse voltage diode may be constructed by utilizing high resistivity material, the forward current is exceedingly low and the diode is unuseable in most applications. In the prior art, the only known manner of obtaining usable semiconductor rectifiers with such capabilities was to electrically interconnect a large number of individual semiconductor diodes in series circuit relationship. By so interconnecting the diodes, the high voltage is distributed across them and the peak inverse voltage of each diode is not exceeded.

It becomes readily apparent that by utilizing a large number of individually packaged semiconductor diodes, the end product becomes relatively expensive and the space consumed becomes prohibitive in some applications.

Accordingly it is an object of the present invention to provide a unitary semiconductor device capable of withstanding high peak inverse voltages which is small, rugged and inexpensive to manufacture.

It is another object of the present invention to provide a semiconductor rectifier which may be readily adapted during the manufacture thereof to withstand predetermined desired values of high peak inverse voltage.

Other and more specific objects of the present invention will become apparent from a consideration of the following description taken in conjunction with the accompanying drawing, which is presented by way of example only and is not intended as a limitation on the present invention, and in which.

In accordance with one aspect of the present invention there is provided a high voltage rectifier which includes a substantially single crystalline semiconductor body having a plurality of serially arranged zones therein. Each successive zone within the semiconductor body is of a conductivity type opposite that of the preceding or succeeding zone, thereby providing a P-N junction between adjacent zones. The conductivity type of the semiconductor material present within each zone is chosen during construction of the device so that alternate junctions are substantially non-rectifying.

In accordance with a more specific aspect of the present invention there is provided a high voltage rectifier including a unitary body of substantially single crystalline semiconductor material. Disposed within the unitary body is a plurality of individual electrical units; each of these units includes first and second zones of opposite conductivity type semi-conductor material defining a P-N junction therebetween. One of the zones of semiconductor material is highly conductive. The other of the zones of the semiconductor material includes two regions therein one of which is highly conductive and one of which is constructed of material having substantially lower conductivity. The individual electrical units are disposed within the unitary body in such a manner that the high conductivity zone and the high conductivity region within the other zone are contiguous, thereby providing substantially non-rectifying electrical contact between adjacent units.

Figure 1:
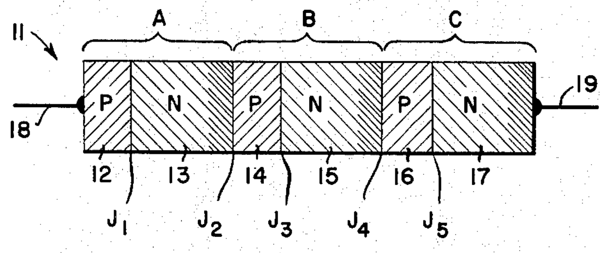
FIG. 1 is a cross sectional view of a semiconductor device in accordance with the present invention.

Referring now to the drawing, and more particularly to FIG. 1 thereof, there is illustrated in cross-section one embodiment of a semiconductor device in accordance with the present invention. It will be apparent to those skilled in the art that the illustration of the semiconductor device of FIG. 1 is schematic only and is greatly exaggerated in size for purposes of clarity of description and illustration.

As is illustrated in FIG. 1 there is provided a unitary semiconductor body 11 which may be constructed of any semiconductor material presently known to the art and preferably is single crystalline semiconductor material. For example, the semiconductor body 11 may consist of silicon, germanium, silicon-germanium alloy, silicon-carbide, Group III–V intermetallic compounds, such as gallium-arsenide, indium-phosphide, aluminum-antimonide, indium-antimonide, and the like. However, for purposes of description only, the following discussion of a semiconductor device is accordance with the present invention will be given with particular reference to the use of silicon as the semiconductor material.

As can be seen in FIG. 1, the unitary semiconductor body 11 which is preferably composed of essentially single crystal silicon is constructed of a plurality of zones 12 through 17 of semiconductor material. The zones are serially arranged within the semiconductor body 11 in such a manner that successive zones of the material are of opposite conductivity type as designated by the letters P and N; for example, zone 12 is a P-type material, while zone 13 is of N-type material. Each of the opposite conductivity type pairs of zones forms a P-N junction therebetween as illustrated at J1 through J5.

As will be noted in the illustration of FIG. 1, adjacent zones within the semiconductor body 11 have been schematically separated into semiconductor diode units A, B and C. This separation is for purposes of description only and it should be expressly understood that the semiconductor body 11 is a unitary structure and that the units are crystallographically interconnected at the interface therebetween.

The conductivity of the silicon material from which the diode of the present invention is constructed varies. The conductivity of each zone as illustrated in FIG. 1 is indicated by the density of the cross-hatching therein; the more dense the cross-hatching, the higher the conductivity. Therefore, as can be seen by referring to each of the various zones within the unitary semi-conductor body 11, the conductivity of the P-type zones and the N-type zones is different and the conductivity within the N-type zone varies from one value to another. The P-type zone has a high conductivity while the N-type zone has a region therein of relatively low conductivity and a region of high conductivity. The region of high conductivity within each of the N-type zones is disposed juxtaposed and is contiguous with the high conductivity P-type zone in the succeeding unit. For example, the high conductivity region of the N-type zone 13 is contiguous with the high conductivity P-type zone 14 which succeeds it. In this manner the crystallographic interconnection between the unit A and the unit B, which includes a junction J2 between zones 13 and 14 within the unitary body 11, is substantially non-rectifying although the conductivity type of the zones 13 and 14 is opposite. It should, however, be noted that the junction J1 which is provided between the high conductivity P-type zone 12 and the low conductivity region of the zone 13 is rectifying. This structure repeats through the semiconductor body 11 in a similar manner and it should become apparent that the junctions J1, J3 and J5 are each rectifying, while the junctions J2 and J4 are substantially nonrectifying. It is in this manner that the internal electrical connection between the units A, B and C of the unitary body 11 is provided. External electrical connection is made to zone 12 by means of connector 18 while external electrical connection is made to zone 17 by means of connector 19. The connectors 18 and 19 may be affixed to the end portions of the unitary body 11 by any means well known to the art, such as alloying, pressure bonding, soldering or the like, to provide ohmic connections to the semiconductor body 11.

Figure 2:
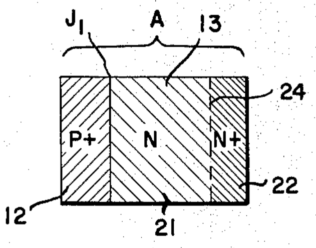
FIG. 2 is a schematic representation of a portion of the device illustrated in FIG. 1.
Figure 3:
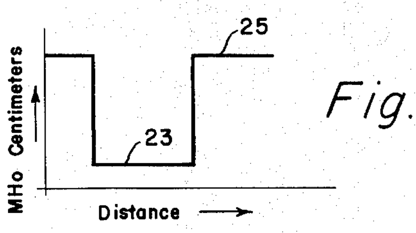
FIG. 3 is a graph illustrating electrical characteristics of the structure of FIG. 2.

The conductivity characteristics of each of the units A, B and C depicted in FIG. 1 may be more clearly understood by reference to FIGS. 2 and 3. As is illustrated in FIG. 2, which is a schematic representation of the unit A of FIG. 1, the P-type zone 12 is of such a conductivity as in usually classified in the semiconductor art as P+. Such a P+ zone has a resistivity on the order of .005 ohm centimeters. The N-type zone 13 includes two regions 21 and 22. The region 21 has a low conductivity as compared to the region 22 which has a high conductivity, similar in degree to that of zone 12, and is normally referred to as N+. The graph of FIG. 3 illustrates the conductivity profile of the unit A as above described and has plotted on the ordinate thereof MHO centimeters and on the abscissa distance along the unit A. As can be seen the P+ region 12 has a relatively high and constant conductivity throughout, while the region 21 of the zone has a low conductivity as compared to the zone 12 and as illustrated at 23 in FIG. 3. Upon reaching the terminal region of zone 21, as indicated by the dashed line 24 therein, the conductivity once again rises to a high level as illustrated at 25. The conductivity profile as illustrated in FIG. 3 substantially repeats for each of the units B and C as indicated in FIG. 1.

A rectifier of the type illustrated in FIG. 1 above described and comprising three units each having a low conductivity N-type region within the N-type zone which region is approximately 12 mils in thickness and of approximately 150 ohm centimeters resistivity is capable of withstanding a peak inverse voltage of approximately 7500 volts.

Figure 4:
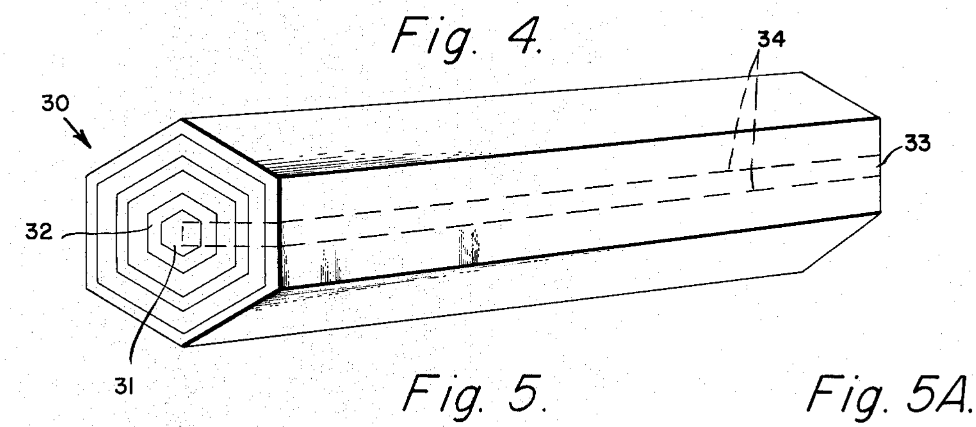
FIGS. 4, 5 and 5A illustrate a semiconductor device in accordance with the present invention during various stages of the manufacture thereof.

A semiconductor high voltage rectifier, in accordance with the present invention, may be constructed from a member of substantially single crystalline silicon semiconductor material as illustrated in FIG. 4. Such a member of semiconductor material may be formed in accordance with the teachings of patent application Serial No. 27,938 filed May 9, 1960, by John E. Allegretti and James Lago, which is assigned to the assignee of the present application. As is disclosed in the Allegretti et al. application, silicon semiconductor material along with a first predetermined concentration of active impurity is deposited upon a heated essentially single crystal semiconductor starting element from a decomposable source thereof in a reaction chamber. After a predetermined period of time during which the desired thickness of semiconductor material has been deposited the reaction chamber is flushed with gas to remove unwanted atoms of active impurity material therefrom. Thereafter additional semiconductor decomposable source material and atoms of active impurity material of a desired type and second predetermined concentration are introduced into the reaction chamber and an additional layer of desired thickness of semiconductor material is deposited in essentially single crystalline form contiguous with the layer of material previously deposited. Each of the two layers are contiguous and are separated by a P-N junction. By referring to FIG. 1 and in conjunction with the description of FIG. 4 it can, therefore, be seen that the core 31 of the member

Figure 5:
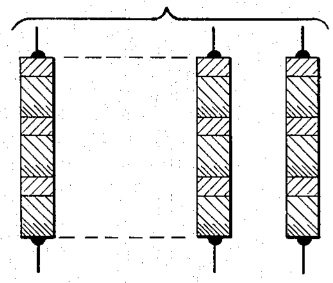
Figure 5A:
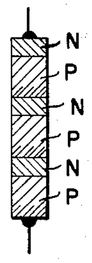

30 illustrated in FIG. 4 may be P+ type semiconductor material such as silicon. After the desired thickness of the core 31 has been established, the reaction chamber is flushed with a gas to remove the P-type active impurity atoms which may be found therein. Thereafter additional decomposable silicon source material and atoms of an N-type active impurity in the concentration desired to obtain the conductivity required, as above described, is introduced into the reaction chamber. By so doing, a layer 32 of low conductivity N-type silicon is deposited upon the core 31. After approximately 12 mils of such N-type silicon has been deposited the active impurity concentration within the decomposable source material is increased to obtain high doped deposited silicon having a conductivity as described above, thereby forming a very low resistivity region upon the outer portion of the layer 32 of N-type material as illustrated in FIG. 4. The process is continued until a silicon member 30, as illustrated in FIG. 4, has been obtained. Thereafter a slice of material, such as is illustrated at 33 within the dashed lines 34, may be taken from the member 30. This may be accomplished by any means well known to the art such as saws, sandblasting, ultrasonic heads, and the like. The member 33 may then be diced into a series of diodes of the type above described and as is illustrated in FIG. 5. Each of the diodes as therein illustrated is substantially the same as that described above in conjunction with FIG. 1. Each of the diodes then has electrical connections made to the opposite end portions thereof and is then housed within any package desired in accordance with well known prior art encapsulation techniques.

Although the above description is concerned only with a semiconductor diode containing three units, it should be expressly understood that any number of units may be utilized and the resistivity or conductivity of each of the zones within the diode may be varied in order to obtain any peak inverse voltage and any forward current which is required in accordance with the particular application under consideration.

It should be further expressly understood that although the individual units, as above described, have followed the pattern of P+NN+ in a repetitive manner throughout the unitary body, it should be expressly understood that each of the units may follow the pattern N+PP+ in a repetitive manner throughout the unitary body as shown in FIG. A.

It will be appreciated that the foregoing description of this invention is detailed for the purposes of illustration but that the invention should not be considered limited to such detail and the scope of the invention should be construed only in accordance with the appended claims.

We claim:

1. A high voltage rectifier comprising: a unitary body of substantially single crystalline semiconductor material having a plurality of similar units disposed in a repetitive serial manner therein, each of said similar units comprising a zone of P-type material and a zone of N-type material defining a P-N junction therebetween, one of said zones having a first predetermined substantially uniform concentration of atoms of one type active impurity material throughout said zone, the other of said zones having two regions, one of said regions having a second predetermined substantially uniform concentration of atoms of an opposite type active impurity material throughout said first region, the other of said regions having a third predetermined substantially uniform concentration of atoms of an opposite type active impurity material throughout said second region, said third concentration being substantially less than either of said first or second concentrations, said units being disposed within said unitary body to provide crystallographic interconnection between said one zone and said one region of adjacent units, said first and second predetermined concentrations being determined to provide a substantially nonrectifying P-N junction at the crystallographic interface between adjacent units, and said third predetermined concentration being determined to provide a rectifying P-N junction at the crystallographic interface between said zones within each unit.

2. A high voltage rectifier comprising: a unitary body of substantially single crystalline semiconductor silicon material having a plurality of similar units disposed in a repetitive serial manner therein, each of said similar units comprising a zone of P-type silicon material and a zone of N-type silicon material defining a P-N junction therebetween, said P-type zone having a first predetermined substantially uniform concentration of atoms of P-type active impurity material throughout said zone, said N-type zone having first and second regions, said first region having a second predetermined substantially uniform concentration of N-type active impurity atoms throughout said first region, said second region having a third predetermined substantially uniform concentration of N-type active impurity atoms throughout said second region, said third predetermined concentration being substantially less than either of said first or second concentrations, said units being disposed within said unitary silicon body to provide crystallographic interconnection between said P-type zone and said first N-type region of adjacent units, said first and second predetermined concentrations being determined to provide a substantially non-rectifying P-N junction at the crystallographic interface between adjacent units, and said third predetermined concentration being determined to provide a rectifying P-N junction at the crystallographic interface between said zones within each unit.

3. A high voltage rectifier comprising: a unitary body of substantially single crystal semiconductor silicon material having a plurality of similar units disposed in a repetitive serial manner therein, each of said similar units comprising a zone of N-type silicon material and a zone of P-type silicon material defining an N-P junction therebetween, said N-type zone having a first predetermined substantially uniform concentration of atoms of N-type active impurity material throughout said zone, said P-type zone having first and second regions, said first region having a second predetermined substantially uniform concentration of P-type active impurity atoms throughout said first region, said second region having a third predetermined substantially uniform concentration of P-type active impurity atoms throughout said second region, said third concentration being substantially less than either of said first or second concentrations, said units being disposed within said unitary silicon body to provide crystallographic interconnection between said N-type zone and said first P-type region of adjacent units, said first and second predetermined concentrations being determined to provide a substantially non-rectifying N-P junction at the crystallographic interface between units, and said third predetermined concentration being determined to provide a rectifying N-P junction at the crystallographic interface between said zones within each unit.

References Cited by the Examiner

UNITED STATES PATENTS

| | | | |
|---|---|---|---|
| 2,708,646 | 5/1955 | North | 317—235 X |
| 2,767,358 | 10/1956 | Early | 317—235 |
| 2,811,653 | 10/1957 | Moore | 317—235 X |
| 2,838,617 | 6/1958 | Tummers et al. | 317—235 X |
| 2,850,414 | 9/1958 | Enomoto | 317—235 X |
| 2,878,152 | 3/1959 | Runyan et al. | 317—235 X |
| 2,884,607 | 4/1959 | Uhlir | 317—234 |
| 2,895,058 | 7/1959 | Pankove | 317—235 X |
| 3,015,762 | 1/1962 | Shockley | 317—234 |
| 3,018,423 | 1/1962 | Aarons et al. | 317—235 |
| 3,036,226 | 5/1962 | Miller | 317—235 |
| 3,046,459 | 7/1962 | Anderson et al. | 317—235 |
| 3,083,302 | 3/1963 | Rutz | 317—235 |

DAVID J. GALVIN, *Primary Examiner.*

SAMUEL BERNSTEIN, JAMES D. KALLAM, *Examiners.*